(12) United States Patent
Lung

(10) Patent No.: US 7,863,655 B2
(45) Date of Patent: Jan. 4, 2011

(54) PHASE CHANGE MEMORY CELLS WITH DUAL ACCESS DEVICES

(75) Inventor: Hsiang-Lan Lung, Elmsford, NY (US)

(73) Assignee: Macronix International Co., Ltd., Hsinchu (TW)

(*) Notice: Subject to any disclaimer, the term of this patent is extended or adjusted under 35 U.S.C. 154(b) by 327 days.

(21) Appl. No.: 11/552,487

(22) Filed: Oct. 24, 2006

(65) Prior Publication Data

US 2008/0106923 A1 May 8, 2008

(51) Int. Cl.
*H01L 27/108* (2006.01)
(52) U.S. Cl. .................................. 257/246; 257/E29.33
(58) Field of Classification Search ......... 257/295–310, 257/E29.33
See application file for complete search history.

(56) References Cited

U.S. PATENT DOCUMENTS

| | | | |
|---|---|---|---|
| 3,271,591 | A | 9/1966 | Ovshinsky |
| 3,530,441 | A | 9/1970 | Ovshinsky |
| 4,452,592 | A | 6/1984 | Tsai |
| 4,599,705 | A | 7/1986 | Holmberg et al. |
| 4,719,594 | A | 1/1988 | Young et al. |
| 4,769,339 | A | 9/1988 | Ishii et al. |
| 4,876,220 | A | 10/1989 | Mohsen et al. |
| 4,959,812 | A | 9/1990 | Momodomi et al. |
| 5,106,775 | A | 4/1992 | Kaga et al. |
| 5,166,096 | A | 11/1992 | Cote et al. |
| 5,166,758 | A | 11/1992 | Ovshinsky et al. |
| 5,177,567 | A | 1/1993 | Klersy et al. |
| 5,332,923 | A | 7/1994 | Takeuchi et al. |
| 5,391,901 | A | 2/1995 | Tanabe et al. |

(Continued)

FOREIGN PATENT DOCUMENTS

WO        WO 00/45108 A1        8/2000

(Continued)

OTHER PUBLICATIONS

"Optimized Thermal Capacitance in a Phase Change Memory Cell Design," IPCOM000141986D, IP.com Prior Art Database, Oct. 18, 2006, 4pp.

(Continued)

*Primary Examiner*—Bradley K Smith
*Assistant Examiner*—Amar Movva
(74) *Attorney, Agent, or Firm*—James F. Hann; Haynes Beffel & Wolfeld LLP

(57) ABSTRACT

A self aligning memory device, with a memory element switchable between electrical property states by the application of energy, includes a substrate and word lines, at least the sides of the word lines covered with a dielectric material which defines gaps. An access device within a substrate has a first terminal under a second gap and second terminals under first and third gaps. First and second source lines are in the first and third gaps and are electrically connected to the second terminals. A first electrode in the second gap is electrically connected to the first terminal. A memory element in the second gap is positioned over and electrically connected to the first electrode. A second electrode is positioned over and contacts the memory element. The first contact, the first electrode, the memory element and the second electrode are self aligning. A portion of the memory element may have a sub lithographically dimensioned width.

9 Claims, 14 Drawing Sheets

U.S. PATENT DOCUMENTS

| | | | |
|---|---|---|---|
| 5,515,488 A | 5/1996 | Hoppe et al. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |
| 5,688,713 A | 11/1997 | Linliu et al. | |
| 5,716,883 A | 2/1998 | Tseng et al. | |
| 5,754,472 A | 5/1998 | Sim et al. | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan | |
| 6,025,220 A | 2/2000 | Sandhu | |
| 6,031,287 A | 2/2000 | Harshfield | |
| 6,034,882 A | 3/2000 | Johnson et al. | |
| 6,046,951 A | 4/2000 | El Hajji et al. | |
| 6,066,870 A | 5/2000 | Siek | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,291,137 B1 | 9/2001 | Lyons et al. | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,326,307 B1 | 12/2001 | Lindley et al. | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 | 8/2002 | Harshfield | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,551,866 B1 | 4/2003 | Maeda et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,576,546 B2 | 6/2003 | Gilbert et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,596,589 B2 | 7/2003 | Tseng et al. | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,620,715 B1 | 9/2003 | Blosse et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,674,115 B2 | 1/2004 | Hudgens et al. | |
| 6,677,678 B2 | 1/2004 | Biolsi et al. | |
| 6,744,088 B1 | 6/2004 | Dennison | |
| 6,746,892 B2 | 6/2004 | Lee et al. | |
| 6,750,079 B2 | 6/2004 | Lowrey et al. | |
| 6,750,101 B2 | 6/2004 | Lung et al. | |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,800,563 B2 | 10/2004 | Xu | |
| 6,808,991 B1 | 10/2004 | Tung et al. | |
| 6,815,704 B1 | 11/2004 | Chen | |
| 6,830,952 B2 | 12/2004 | Lung et al. | |
| 6,838,692 B1 | 1/2005 | Lung et al. | |
| 6,850,432 B2 | 2/2005 | Lu et al. | |
| 6,859,389 B2 | 2/2005 | Idehara et al. | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,881,603 B2 | 4/2005 | Lai | |
| 6,888,750 B2 | 5/2005 | Walker et al. | |
| 6,894,304 B2 | 5/2005 | Moore | |
| 6,894,305 B2 | 5/2005 | Yi et al. | |
| 6,900,517 B2 | 5/2005 | Tanaka et al. | |
| 6,903,362 B2 | 6/2005 | Wyeth et al. | |
| 6,909,107 B2 | 6/2005 | Rodgers et al. | |
| 6,910,907 B2 | 6/2005 | Layadi et al. | |
| 6,927,410 B2 | 8/2005 | Chen | |
| 6,928,022 B2 | 8/2005 | Cho et al. | |
| 6,933,516 B2 | 8/2005 | Xu | |
| 6,936,544 B2 | 8/2005 | Huang et al. | |
| 6,936,840 B2 | 8/2005 | Sun et al. | |
| 6,937,507 B2 | 8/2005 | Chen | |
| 6,943,365 B2 | 9/2005 | Lowrey et al. | |
| 6,969,866 B1 | 11/2005 | Lowrey et al. | |
| 6,972,428 B2 | 12/2005 | Maimon | |
| 6,972,430 B2 | 12/2005 | Casagrande et al. | |
| 6,977,181 B1 | 12/2005 | Raberg et al. | |
| 6,992,932 B2 | 1/2006 | Cohen | |
| 7,023,009 B2 | 4/2006 | Kostylev et al. | |
| 7,033,856 B2 | 4/2006 | Lung et al. | |
| 7,038,230 B2 | 5/2006 | Chen et al. | |
| 7,038,938 B2 | 5/2006 | Kang et al. | |
| 7,042,001 B2 | 5/2006 | Kim et al. | |
| 7,054,183 B2 | 5/2006 | Rinerson et al. | |
| 7,067,837 B2 | 6/2006 | Hwang et al. | |
| 7,067,864 B2 | 6/2006 | Nishida et al. | |
| 7,067,865 B2 | 6/2006 | Lung et al. | |
| 7,071,485 B2 * | 7/2006 | Takaura et al. ............... 257/3 |

| Patent No. | Date | Inventor |
|---|---|---|
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,132,675 B2 | 11/2006 | Gilton |
| 7,154,774 B2 | 12/2006 | Bedeschi et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,394,088 B2 | 7/2008 | Lung |
| 7,397,060 B2 | 7/2008 | Lung |
| 7,423,300 B2 | 9/2008 | Lung et al. |
| 7,426,134 B2 | 9/2008 | Happ et al. |
| 7,449,710 B2 | 11/2008 | Lung |
| 2001/0055838 A1 | 12/2001 | Walker et al. |
| 2002/0070457 A1 | 6/2002 | Sun et al. |
| 2002/0072223 A1 | 6/2002 | Gilbert et al. |
| 2002/0081833 A1 | 6/2002 | Li et al. |
| 2002/0113273 A1 | 8/2002 | Hwang et al. |
| 2002/0182835 A1 | 12/2002 | Quinn |
| 2003/0072195 A1 | 4/2003 | Mikolajick |
| 2003/0095426 A1 | 5/2003 | Hush et al. |
| 2003/0186481 A1 | 10/2003 | Lung |
| 2004/0026686 A1 | 2/2004 | Lung |
| 2004/0051094 A1 | 3/2004 | Ooishi |
| 2004/0051161 A1 | 3/2004 | Tanaka et al. |
| 2004/0113137 A1 | 6/2004 | Lowrey |
| 2004/0113232 A1 | 6/2004 | Johnson et al. |
| 2004/0165422 A1 | 8/2004 | Hideki et al. |
| 2004/0178172 A1 | 9/2004 | Huang et al. |
| 2004/0208038 A1 | 10/2004 | Idehara |
| 2004/0248339 A1 | 12/2004 | Lung |
| 2004/0256610 A1 | 12/2004 | Lung |
| 2005/0018526 A1 | 1/2005 | Lee |
| 2005/0019975 A1 | 1/2005 | Lee et al. |
| 2005/0029502 A1 | 2/2005 | Hudgens |
| 2005/0062087 A1 | 3/2005 | Chen et al. |
| 2005/0093022 A1 | 5/2005 | Lung |
| 2005/0106919 A1 | 5/2005 | Layadi et al. |
| 2005/0127349 A1 | 6/2005 | Horak et al. |
| 2005/0130414 A1 | 6/2005 | Choi et al. |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2005/0285096 A1 | 12/2005 | Kozicki |
| 2006/0006472 A1 | 1/2006 | Jiang |
| 2006/0038221 A1 | 2/2006 | Lee et al. |
| 2006/0043617 A1 | 3/2006 | Abbott |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157681 A1 | 7/2006 | Chen et al. |
| 2006/0163554 A1 | 7/2006 | Lankhorst et al. |
| 2006/0175599 A1 | 8/2006 | Happ |
| 2006/0198183 A1 | 9/2006 | Kawahara et al. |
| 2006/0202245 A1* | 9/2006 | Zuliani et al. ............ 257/296 |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0281216 A1 | 12/2006 | Chang et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289848 A1 | 12/2006 | Dennison |
| 2007/0008786 A1 | 1/2007 | Scheuerlein |
| 2007/0010054 A1 | 1/2007 | Fan et al. |
| 2007/0030721 A1 | 2/2007 | Segal et al. |
| 2007/0037101 A1 | 2/2007 | Morioka |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |

| | | | |
|---|---|---|---|
| 2007/0215852 A1 | 9/2007 | Lung | |
| 2007/0224726 A1 | 9/2007 | Chen et al. | |
| 2007/0235811 A1 | 10/2007 | Furukawa et al. | |
| 2007/0236989 A1 | 10/2007 | Lung | |
| 2007/0246699 A1 | 10/2007 | Lung | |
| 2007/0249090 A1 | 10/2007 | Philipp et al. | |
| 2007/0257300 A1 | 11/2007 | Ho et al. | |
| 2007/0262388 A1 | 11/2007 | Ho et al. | |
| 2007/0274121 A1 | 11/2007 | Lung et al. | |
| 2007/0285960 A1 | 12/2007 | Lung et al. | |
| 2007/0298535 A1 | 12/2007 | Lung | |
| 2008/0006811 A1 | 1/2008 | Philipp et al. | |
| 2008/0012000 A1 | 1/2008 | Harshfield | |
| 2008/0014676 A1 | 1/2008 | Lung et al. | |
| 2008/0025089 A1 | 1/2008 | Scheuerlein et al. | |
| 2008/0043520 A1 | 2/2008 | Chen | |
| 2008/0094871 A1 | 4/2008 | Parkinson | |
| 2008/0101110 A1 | 5/2008 | Happ et al. | |
| 2008/0137400 A1 | 6/2008 | Chen et al. | |
| 2008/0164453 A1 | 7/2008 | Breitwisch et al. | |
| 2008/0165569 A1 | 7/2008 | Chen et al. | |
| 2008/0165570 A1 | 7/2008 | Happ et al. | |
| 2008/0165572 A1 | 7/2008 | Lung | |
| 2008/0166875 A1 | 7/2008 | Lung | |
| 2008/0179582 A1 | 7/2008 | Burr et al. | |
| 2008/0180990 A1 | 7/2008 | Lung | |
| 2008/0186755 A1 | 8/2008 | Lung et al. | |
| 2008/0191187 A1 | 8/2008 | Lung et al. | |
| 2008/0192534 A1 | 8/2008 | Lung | |
| 2008/0197334 A1 | 8/2008 | Lung | |
| 2008/0224119 A1 | 9/2008 | Burr et al. | |
| 2008/0225489 A1 | 9/2008 | Cai et al. | |

FOREIGN PATENT DOCUMENTS

| | | | |
|---|---|---|---|
| WO | WO 00/79539 A1 | 12/2000 | |
| WO | WO 01/45108 A1 | 6/2001 | |
| WO | 0225733 | 3/2002 | |

OTHER PUBLICATIONS

"Thermal Conductivity of Crystalline Dielectrics" in CRC Handbook of Chemistry and Physics, Internet Version 2007, (87th edition), David R. Lide, ed. Taylor and Francis, Boca Raton, FL, 2 pp.

Atwood, G, et al., "90nm Phase Change Technology with ? Trench and Lance Cell Elements," VLSI Technology, Systems and Applications, Apr. 23-25, 2007, pp. 1-2.

Chao, Der-Sheng, et al., "Low Programming Current Phrase Change Memory Cell with Double GST Thermally Confined Structure," Int'l Symp on VLSI Technology, Systems and Applications, Apr. 23-25, 2007, pp. 1-2.

Schafft, Harry A. et al., "Thermal Conductivity Measurments of Thin Films Silicon Dioxide", Proceedings of the IEEE 1989 International Conference on Microelectronic Test Structures vol. 2, No. 1, Mar. 1989, pp. 121-124.

Adler, David, "Amorphous-Semiconductor Devices," Sci. Amer., vol. 236, pp. 36-48, May 1977.

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM , Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at $3^{rd}$ E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE $43^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era- vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Ahn, S. J. et al., "Highly Reliable 5nm Contact Cell Technology for 256Mb PRAM," VLSI Technology, Digest of Technical Papers, Jun. 14-16, 2005, pp. 98-99.

Yamada, Noboru, "Potential of Ge-Sb-Te phase-change optical disks for high-data-rate recording in the near future," (Conference Proceedings Paper), Jul. 30, 1997, vol. 3109, 10 pages.

* cited by examiner

PHASE CHANGE MEMORY CELLS WITH DUAL ACCESS DEVICES

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on phase change based memory materials, including chalcogenide based materials and other materials, and to methods for operating such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material that differ in the two phases.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or break down the crystalline structure, after which the phase change material cools quickly, quenching the phase change process and allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element. Even with small devices, the reset current remains a design limitation for high density and low voltage integrated circuits.

As the phase change memory cell structures are made small, a limiting factor on the density of a device incorporating an array of phase change memory cells is the array architecture, including access transistors, word lines and bit lines through which individual memory cells are accessed for read, set and reset operations. Typical array architectures are shown in Lung, "Spacer Chalcogenide Memory Method and Device," U.S. Pat. No. 6,864,503; and Wu, "Self-Aligned Resistive Plugs for Forming Memory Cell with Phase Change Material," U.S. Pat. No. 6,545,903. In the '503 patent, the architecture for an array of phase change memory cells is shown in FIG. 3, and includes access transistors (called isolation transistors in the '503 patent) that are formed on a semiconductor substrate, and a conductive plug formed in a contact via is formed between the drain of each access transistor and an electrode in the corresponding phase change memory cell. The array size is limited by the need to space the access transistors apart from one another in the semiconductor substrate, or to otherwise isolate adjacent access transistors. One array architecture that provides for high density is shown in Kang, et al., "A 0.1 MM 1.8V 256 Mb 66 MHz Synchronous Burst PRAM", ISSCC, February, 2006.

It is desirable therefore to provide devices with an array architecture supporting high-density devices, and to facilitate applying relatively high currents to selected devices for reset operations at low voltages.

SUMMARY OF THE INVENTION

A first embodiment of the present invention is a self aligning memory device, the memory device of the type comprising a memory element switchable between electrical property states by the application of energy. The memory device includes a substrate and first, second, third and fourth word lines positioned over the substrate and oriented in a first direction. The word lines have tops and sides, at least the sides covered with a dielectric material. The dielectric material defines first and second and third gaps therebetween. The memory device also includes terminals of access devices formed within the substrate, a first terminal located directly under the second gap and a second terminal formed directly under each of the first and third gaps. First and second source lines are positioned within the first and third gaps and are electrically connected to respective ones of the second terminals. A first electrode is positioned within the second gap and is electrically connected to the first terminal. A memory element is within the second gap and is positioned over and electrically connected to the first electrode. A second electrode is positioned over and in contact with the memory element. The second electrode is oriented in a second direction, the second direction being perpendicular to the first direction. The first contact, the first electrode, the memory element and the second electrode are self aligning. In some embodiments the access devices comprise first and second transistors with a common drain. In some embodiments the word lines are separated by a distance equal to a minimum lithographic distance so that at least a portion of the gap is a sub lithographically dimensioned gap with at least a portion of the memory element having a sub lithographically dimensioned width.

One example of a method for making a self aligning memory device, the memory device of the type comprising a memory element switchable between electrical property states by the application of energy, carried out according to the present invention includes the following. First, second, third and fourth word line conductors are formed on a substrate, each word line conductor having a word line top and word line sides. Dielectric sidewall spacers are formed on the word line sides, the sidewall spacers spaced apart from one another by first, second and third gaps with the substrate exposed at the gaps. First and second terminals of an access device are formed within the substrate at the first, second and third gaps. A first terminal is located directly under the second gap and a second terminal is formed directly under each of the first and third gaps. A source line is formed in the first and third gaps and is electrically connected to respective ones of the second terminals. A first electrode is formed in the second gap and is electrically connected to the first terminal. A memory material is deposited in the second gap to form a memory element in electrical contact with the first electrode.

A second electrode is formed to be in electrical contact with the memory element. In some embodiments the dielectric sidewall spacers forming step is carried out so that the word line conductors are separated by a distance equal to a minimum lithographic distance with the dielectric sidewall spacers defining the first, second and third gaps with at least a portion of the gaps being a sub lithographically dimensioned gaps; in such embodiments the memory element has a width defined by the second gap with at least a portion of the width being a sub lithographically dimensioned width.

The memory cell and access control device structure described enables dense, high capacity memory arrays using phase change memory cells operating at low voltages.

Other aspects and advantages of the invention are described below with reference to the figures.

DETAILED DESCRIPTION OF THE INVENTION

Figure 1:
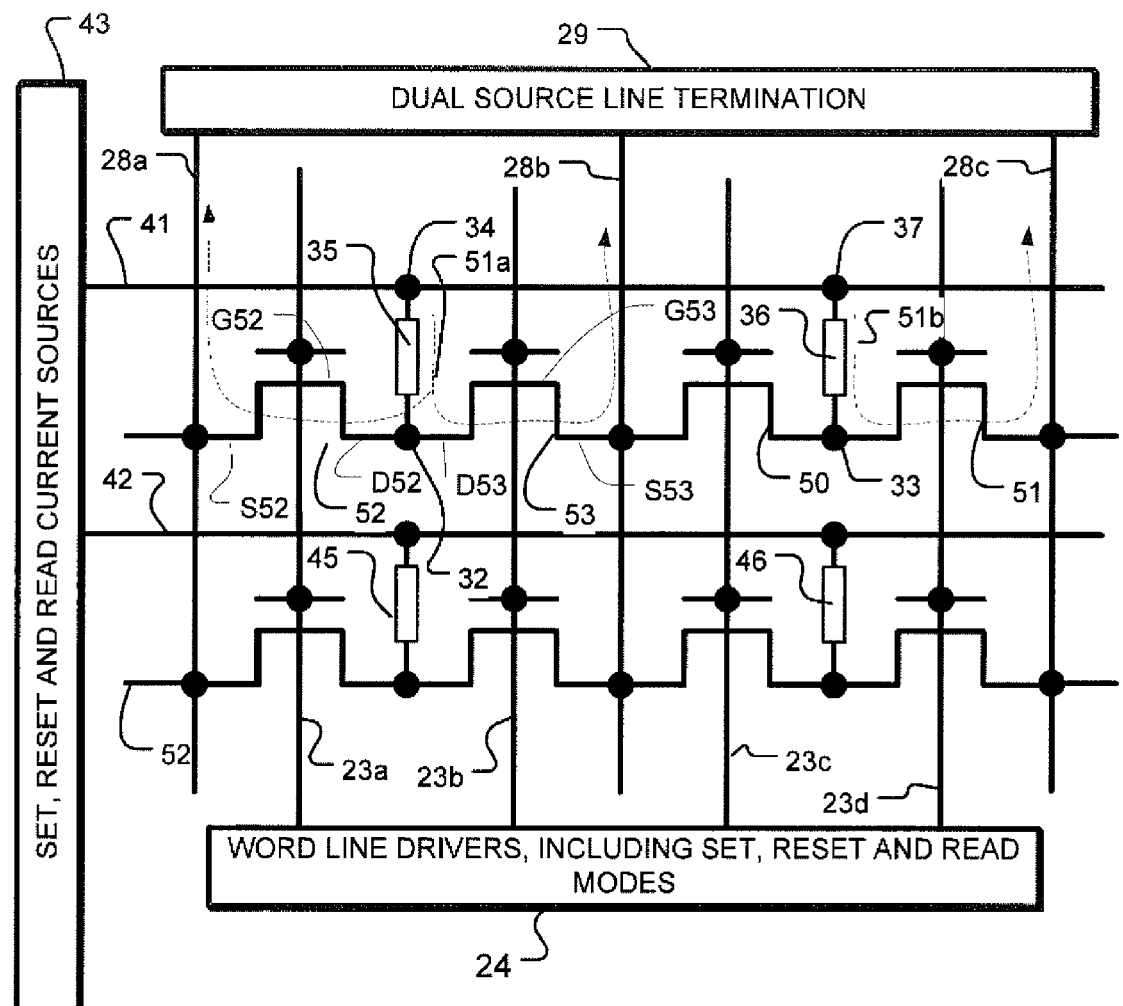
FIG. 1 is a schematic diagram for a memory array comprising phase change memory cells with dual source lines and dual word lines.

The following description of the invention will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

A detailed description of phase change memory cells with dual access devices, arrays of such memory cells, and methods for manufacturing and operating such memory cells, is provided with reference to FIGS. 1-23.

Figure 3:
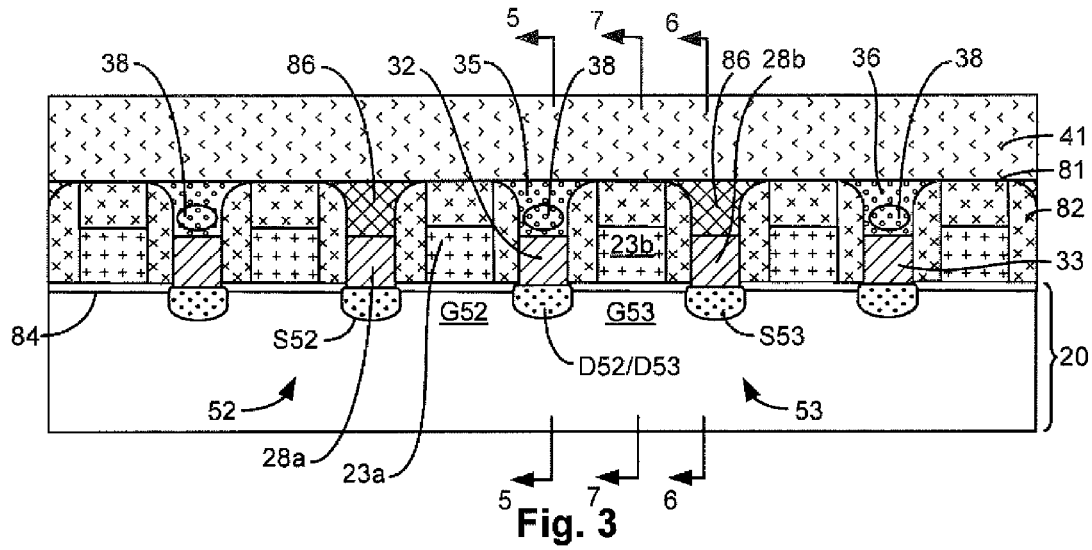
FIG. 3 is a cross-sectional view of a memory device may according to the invention, the view taken parallel to and through a bit line.

FIG. 1 is a schematic illustration of a memory array, with dual word lines and dual source lines, and self-aligned contact/memory element between memory cell electrodes and the access array, which can be implemented as described herein. Four memory cells including memory elements 35, 36, 45 and 46 are illustrated, representing a small section of an array that can include millions of memory cells. Memory cells including memory elements 35 and 36 are representative. As can be seen, the memory cell including memory element 35 includes a top electrode 34 and a bottom electrode 32, with the memory element 35 comprising a phase change material in electrical communication with the top and bottom electrodes 34, 32. Likewise, the memory cell including memory element 36 includes a top electrode 37 and a bottom electrode 33. The top electrodes 37, 34 are coupled to a bit line 41. The memory cells including memory elements 45 and 46 are connected in a similar fashion. As shown in FIG. 3, each memory element has a phase change region 38 near its bottom electrode.

FIG. 1, the common source lines 28a, 28b and 28c, the word lines 23a, 23b, 23c and 23d are arranged generally parallel in the Y-direction (as opposed to the normal convention of illustrating word lines arranged in the X-direction). Bit lines 41 and 42 are arranged generally parallel in the X-direction. Thus, a Y-decoder and a word line driver 24, having set, reset and read modes, are coupled to the word lines 23a, 23b, 23c, 23d. Bit line current sources 43 for set, reset and read modes, a decoder and sense amplifiers (not shown) are coupled to the bit lines 41 and 42. The common source lines 28a, 28b and 28c are coupled to source line termination circuit 29, such as a ground terminal. The source line termination circuits may include bias circuits such as voltage sources and current sources, and decoding circuits for applying bias arrangements, other than ground, to the source lines in some embodiments.

Each memory cell in the illustrated array is coupled to first and second access transistors. Thus, the bottom electrode 32 of the memory cell including memory element 35 is coupled to the drain D53 of access transistor 53 and to the drain D52 of access transistor 52. The source terminals S52, S53 of access transistors 52 and 53 are coupled to respective source lines 28a and 28b. The gate G52 of access transistor 52 is coupled to the word line 23a. The gate G53 of access transistor 53 is coupled to the word line 23b. In a similar fashion, the bottom electrode 33 of the memory cell including memory element 36 is coupled to the drain of access transistor 50 and to the drain of access transistor 51. The source terminals of access transistors 50 and 51 are coupled to respective source lines 28b and 28c. The gate of access transistor 50 is coupled to the word line 23c. The gate of access transistor 51 is coupled to the word line 23d.

It can be seen that the common source line 28b is shared by two rows of memory cells, where a row is arranged in the Y-direction in the illustrated schematic.

In operation, current sources 43 and the word line drivers 24 operate in a lower current read mode, one or more intermediate current set modes, and a higher current reset mode. During the higher current reset mode, a current path 51a through the selected memory cell (e.g. memory cell including element 35) is established by applying a current to the bit line 41, and voltages on the word line conductors 23a and 23b sufficient to turn on the access transistors 52 and 53, so that the current flows through both source line 28a and source line 28b. The dual word line conductors 23a, 23b and the dual source line conductors 28a and 28b, establish a lower resistance path to ground than can be established using only a single source line conductor. Therefore, the current source used during the higher current reset mode can operate at lower voltages, and more efficiently couple power to the memory element needed to achieve the reset state.

In contrast, during the lower current read mode, a current path 51b through the selected memory cell (see the memory cell including memory element 36) is established by applying a current to the bit line 41, and a voltage on the word line conductor 23d sufficient to turn on the access transistor 51 and provide for current flow to the source line conductor 28c. The voltage on the word line conductor 23c is kept at a level that is sufficient to turn off the access transistor 50, and block current flow to the source line conductor 28b. This provides for a lower capacitance in the circuitry used in the lower current read mode, and allows for faster operation of the read mode.

During the set mode, used for one or more intermediate current levels, only one access transistor is enabled, as just described with respect to the read mode. Alternatively, during the set mode, two access transistors may be used as described above with respect to the reset mode, depending on the design goals of the particular implementation.

Embodiments of the memory cell include phase change based memory materials, including chalcogenide based materials and other materials, for the memory element 35, 36, 45, 46. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IV of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$, (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined empirically or by modeling, and specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

The following are short summaries describing four types of resistive memory materials.

1. Chalcogenide Material
   $Ge_xSb_yTe_z$
   x:y:z=2:2:5
   Or other compositions with x: 0~5; y: 0~5; z: 0~10
   GeSbTe with doping, such as N—, Si—, Ti—, or other element doping may also be used.
   Formation method: By PVD sputtering or magnetron-sputtering method with reactive gases of Ar, $N_2$, and/or He, etc chalcogenide @ the pressure of 1 mtorr~100 mtorr. The deposition is usually done at room temperature. The collimator with aspect ratio of 1~5 can be used to improve the fill-in performance. To improve the fill-in performance, the DC bias of several ten to several hundred volts is also used. On the other hand, the combination of DC bias and the collimator can be used simultaneously.
   The post deposition annealing treatment with vacuum or N2 ambient is sometimes needed to improve the crystallize state of chalcogenide material. The annealing temperature typically ranges 100 C to 400 C with an anneal time of less than 30 minutes.
   The thickness of chalcogenide material depends on the design of cell structure. In general, a chalcogenide material with thickness of higher than 8 nm can have a phase change characterization so that the material exhibits at least two stable resistance states.

2. CMR (Colossal Magneto Resistance) Material
   $Pr_xCa_yMnO_3$
   x:y=0.5:0.5
   Or other compositions with x: 0~1; y: 0~1
   Another CMR material that includes Mn oxide may be used
   Formation method: By PVD sputtering or magnetron-sputtering method with reactive gases of Ar, $N_2$, $O_2$, and/or He, etc. at the pressure of 1 mtorr~100 mtorr. The deposition temperature can range from room temperature to ~600 C, depending on the post deposition treatment condition. A collimator with an aspect ratio of 1~5 can be used to improve the fill-in performance. To improve the fill-in performance, the DC bias of several ten to several hundred volts is also used. On the other hand, the combination of DC bias and the collimator can be used simultaneously. A magnetic field of several ten gauss to 10,000 gauss may be applied to improve the magnetic crystallized phase.
   The post deposition annealing treatment with vacuum or $N_2$ ambient or $O_2/N_2$ mixed ambient may be needed to improve the crystallized state of CMR material. The annealing temperature typically ranges 400 C to 600 C with an anneal time of less than 2 hours.
   The thickness of CMR material depends on the design of cell structure. The CMR thickness of 10 nm to 200 nm can be used to be the core material.
   A buffer layer of YBCO (YBaCuO3, a kind of high temperature superconductor material) is often used to improve the crystallized state of CMR material. The YBCO is deposited before the deposition of CMR material. The thickness of YBCO ranges 30 nm to 200 nm.

3. 2-Element Compound
   $Ni_xO_y$; $Ti_xO_y$; $Al_xO_y$; $W_xO_y$; $Zn_xO_y$; $Zr_xO_y$; $Cu_xO_y$; etc
   x:y=0.5:0.5
   Other compositions with x: 0~1; y: 0~1
   Formation method:
   1. Deposition: By PVD sputtering or magnetron-sputtering method with reactive gases of Ar, $N_2$, $O_2$, and/or He, etc. at the pressure of 1 mtorr~10 mtorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimator with an aspect ratio of 1~5 can be used to improve the fill-in performance. To improve the fill-in performance, the DC bias of several ten to several hundred volts is also used. If desired, they combination of DC bias and the collimator can be used simultaneously.
   The post deposition annealing treatment with vacuum or $N_2$ ambient or $O_2/N_2$ mixed ambient as sometimes needed to improve the oxygen distribution of metal oxide. The annealing temperature ranges 400 C to 600 C with an anneal time of less than 2 hours.
   2. Reactive deposition: By PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mtorr~100 mtorr, using a target of metal oxide, such as Ni, Ti, Al, W, Zn, Zr, or Cu etc. The deposition is usually done at room temperature. A collimator with an aspect ratio of 1~5 can be used to improve the fill-in performance. To improve the fill-in performance, a DC bias of several ten to several hundred volts is also used. If desired, the combination of DC bias and the collimator can be used simultaneously.
   The post deposition annealing treatment with vacuum or $N_2$ ambient or $O_2/N_2$ mixed ambient is sometimes needed to improve the oxygen distribution of metal oxide. The annealing temperature ranges 400 C to 600 C with an anneal time of less than 2 hours.
   3. Oxidation: By a high temperature oxidation system, such as furnace or RTP system. The temperature ranges from 200 C to 700 C with pure $O_2$ or $N_2/O_2$ mixed gas at a pressure of several mtorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mtorr to 100 mtorr is used to oxidize the surface of metal, such as Ni, Ti, Al, W, Zn, Zr, or Cu etc. The oxidation time ranges several seconds to several minutes. The oxidation temperature ranges room temperature to 300 C, depending on the degree of plasma oxidation.

4. Polymer Material
   TCNQ with doping of Cu, $C_{60}$, Ag etc.
   PCBM-TCNQ mixed polymer
   Formation method:
   1. Evaporation: By thermal evaporation, e-beam evaporation, or molecular beam epitaxy (MBE) system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of 10-4 torr to 10-10 torr. The wafer temperature ranges from room temperature to 200 C.
   The post deposition annealing treatment with vacuum or $N_2$ ambient is sometimes needed to improve the composition distribution of polymer material. The annealing temperature ranges room temperature to 300 C with an anneal time of less than 1 hour.

2. Spin-coat: By a spin-coater with the doped-TCNQ solution @ the rotation of less than 1000 rpm. After spin-coating, the wafer is put to wait the solid-state formation @ room temperature or temperature of less than 200 C. The waiting time ranges from several minutes to days, depending on the temperature and on the formation conditions.

An exemplary method for forming chalcogenide material uses the PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimator can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states. It is expected that some materials are suitable with even lower thicknesses.

Figure 2:
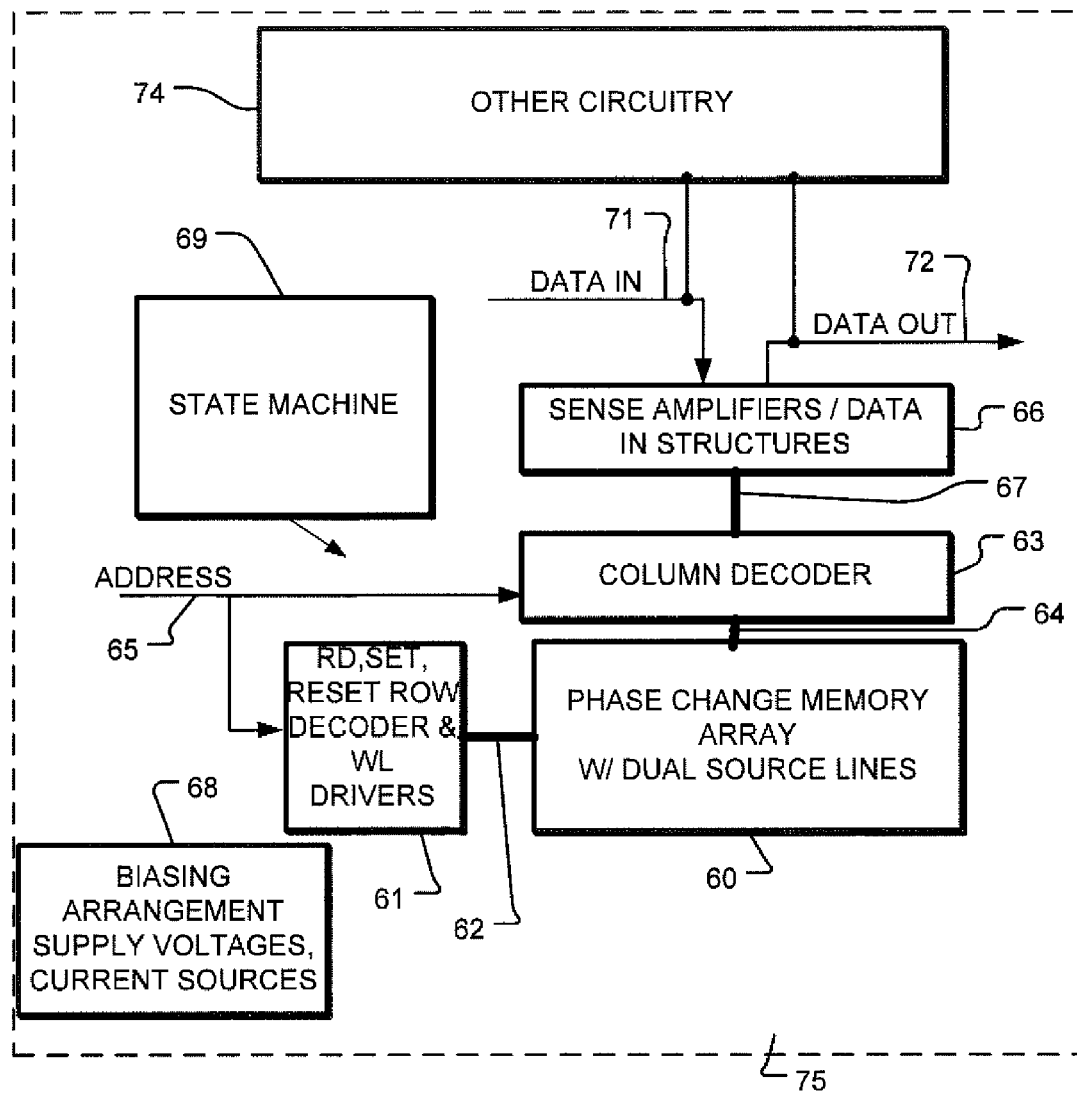
FIG. 2 is a block diagram of an integrated circuit device including a phase change memory array with dual source lines and dual word lines, and other circuitry.

FIG. 2 is a simplified block diagram of an integrated circuit according to an embodiment of the present invention. The integrated circuit 75 includes a memory array 60 implemented using phase change memory cells with self-aligned contacts and isolation lines, on a semiconductor substrate. A row decoder 61 having read, set and reset modes is coupled to a plurality of pairs of word lines 62, and arranged along rows in the memory array 60. A column decoder 63 is coupled to a plurality of bit lines 64 arranged along columns in the memory array 60 for reading, setting and resetting memory cells in the memory array 60. Addresses are supplied on bus 65 to column decoder 63 and row decoder 61. Sense amplifiers and data-in structures in block 66, including current sources for the read, set and reset modes, are coupled to the column decoder 63 via data bus 67. Data is supplied via the data-in line 71 from input/output ports on the integrated circuit 75 or from other data sources internal or external to the integrated circuit 75, to the data-in structures in block 66. In the illustrated embodiment, other circuitry 74 is included on the integrated circuit 75, such as a general purpose processor or special purpose application circuitry, or a combination of modules providing system-on-a-chip functionality supported by the phase change memory cell array. Data is supplied via the data-out line 72 from the sense amplifiers in block 66 to input/output ports on the integrated circuit 75, or to other data destinations internal or external to the integrated circuit 75.

A controller implemented in this example using bias arrangement state machine 69 controls the application of bias arrangement supply voltages and current sources 68, such as read, set, reset and verify voltages and or currents for the word lines and bit lines, and controls the dual word line/source line operation using an access control process such as described below with reference to FIG. 23. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

FIGS. 3-7 depict structure for a phase change random access memory (PCRAM) cells and self-aligned contacts/memory elements/source lines with access transistors, manufactured as described with reference to FIGS. 8-21. The cells are formed on a semiconductor substrate 20. Access transistor pairs 52, 53 are formed by n-type terminals acting as source regions S52, S53 and an n-type terminal acting as a common drain region D52/D53 in a p-type substrate 20. Polysilicon word lines 23a, 23b form the gates G52, G53 of the access transistors 52, 53 for memory element 35. The pattern repeats along the column of access transistors. The terminals S52, S53 and D52/D53 of the access transistors 52, 53 comprise doped regions in the substrate which can be implemented by self-aligned implant processes using the polysilicon word lines 23a, 23b as masks. The self-alignment arises in the embodiment described herein by using the word line structures to define gaps therebetween, the gaps used to locate the access transistor terminals over which plugs, constituting source lines and bottom electrodes, are formed, with memory elements and a bit lines formed over the bottom electrodes without requiring an additional lithographic mask to locate the elements.

Figure 4:
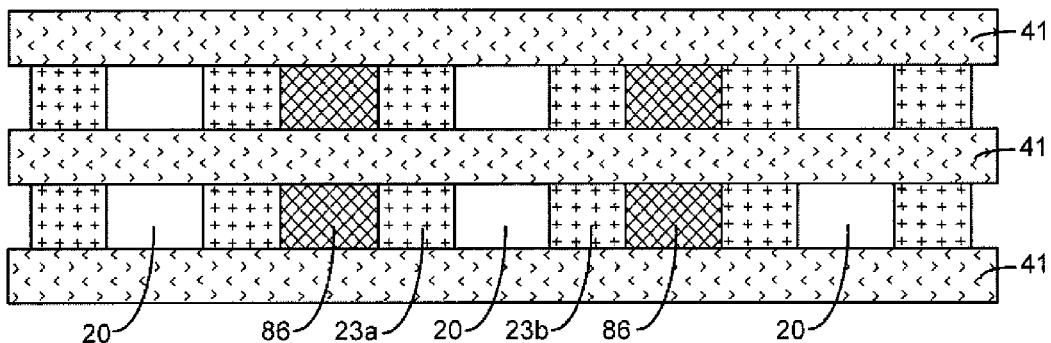
FIG. 4 is top plan view of the structure of FIG. 3.
Figure 5:
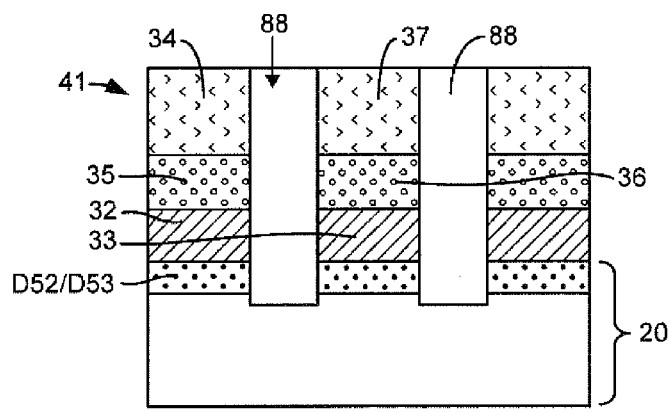
FIGS. 5, 6 and 7 are side cross-sectional views taken along lines 5-5, 6-6 and 7-7 of FIG. 3.
Figure 6:
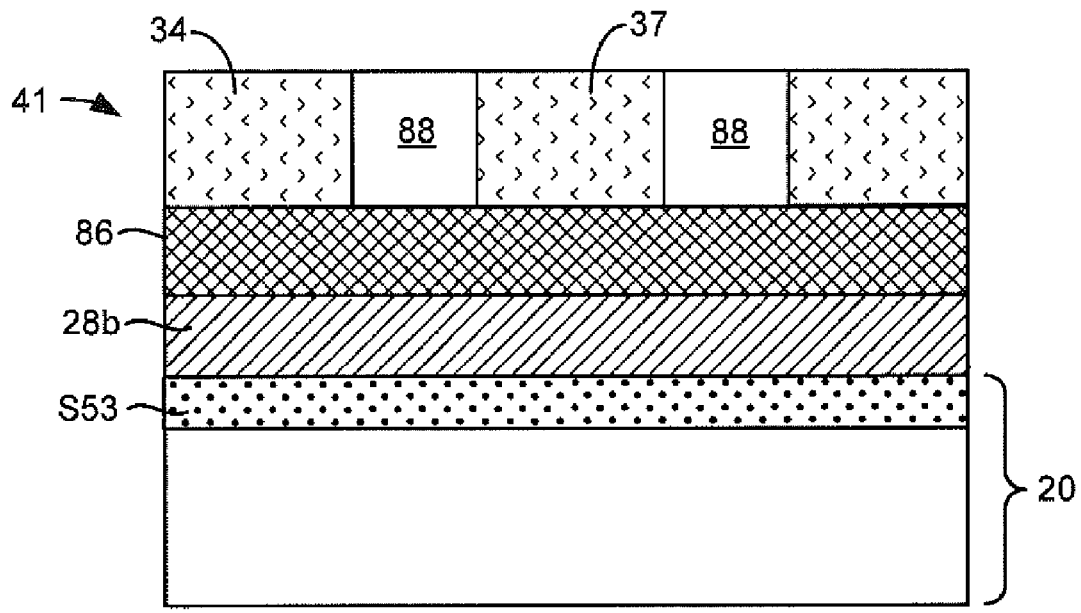
Figure 7:
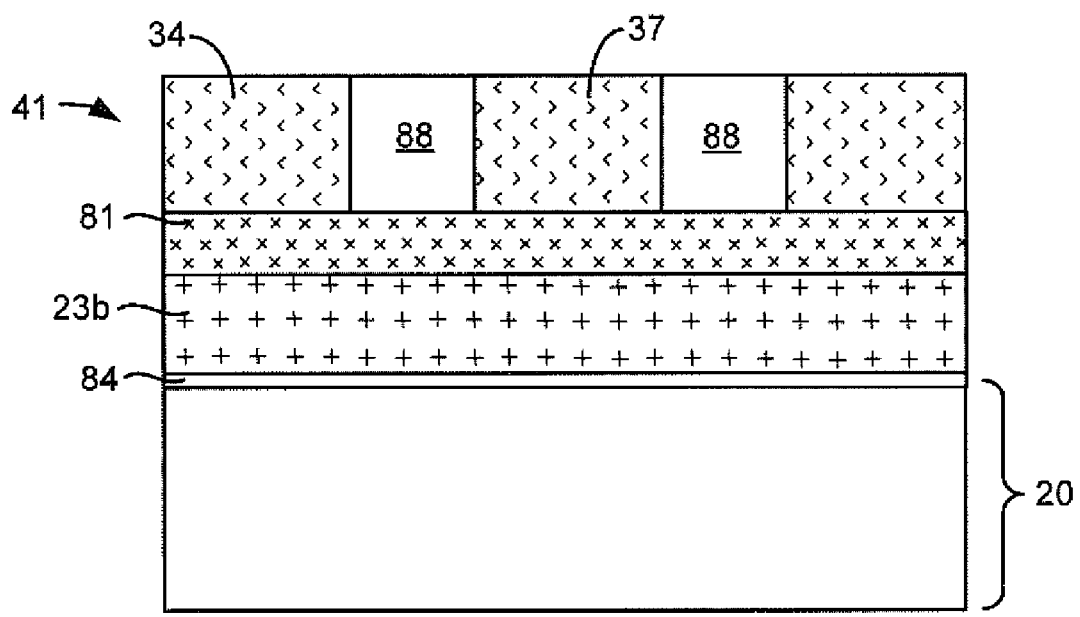

A gate oxide layer 84 is formed in substrate 20 with word lines 23 formed on layer 84. Each word line 23 is covered by a cap 80 surrounded on either side by a spacer 82. Cap 80 and spacer 82 are typically nitride. A dielectric 86, typically $SiO_2$, is formed on top of the common source lines 28. Bit lines 41, 42 are formed on top of memory elements 35, 36, dielectric 86 and nitride cap 80. Dielectric-filled trenches 88 are formed perpendicular to the bit lines and thus separate the bit lines as well as the memory elements, bottom electrodes and drains as shown in FIG. 5. The dielectric material within trenches 88 is omitted from FIGS. 4-7 for clarity. Dielectric-filled trenches 88 are seen in FIG. 6 to also separate nitride caps 80 and bit lines 41 but not the common source lines 28 or the sources of the access transistors. Similarly, dielectric-filled trenches 88 are seen in FIG. 7 to separate bit lines 41 and dielectric 86 but not the word lines 23 or the gate oxide layer 84. Providing dielectric-filled trenches 88 having different depths may be achieved in a conventional or unconventional manner, such as by the use of appropriate etch stop layers.

Figure 8:
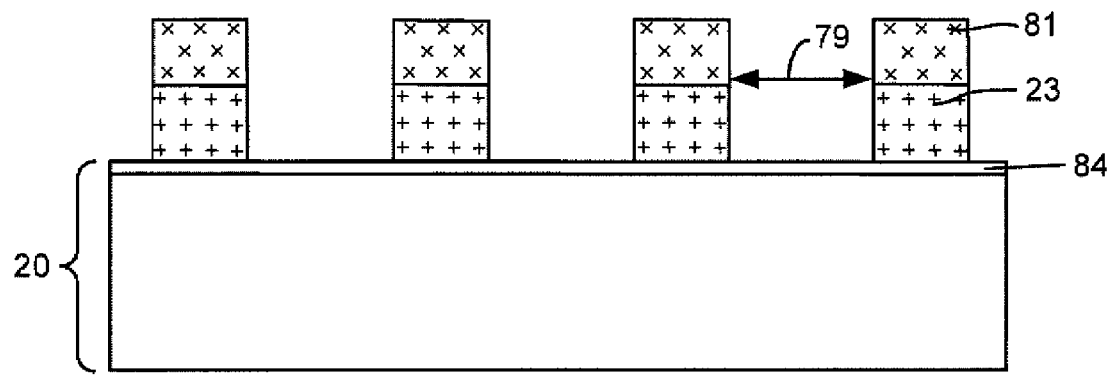
FIG. 8 illustrates word lines, covered by dielectric layers, on a substrate.

FIG. 8 illustrates result of having deposited gate oxide layer 84 on substrate 20 followed by a layer of polysilicon followed by a layer of a hard mask dielectric material, such as SiN, after which suitable etching procedures create word lines 23 and dielectric layers 81 covering the tops of the word lines. Word lines 23 and their associated dielectric layers 81 are separated by a distance 79, distance 79 preferably being equal to the minimum lithographic features size for the lithographic procedures used to create the word lines and dielectric layers.

Figure 8A:
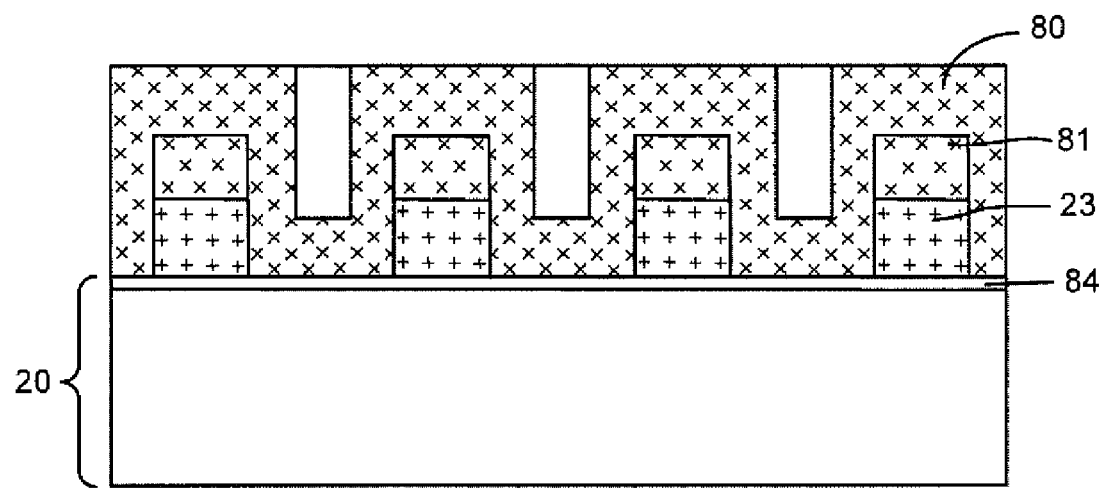
FIG. 8A shows a nitride layer deposited on the structure of FIG. 8.
Figure 8B:
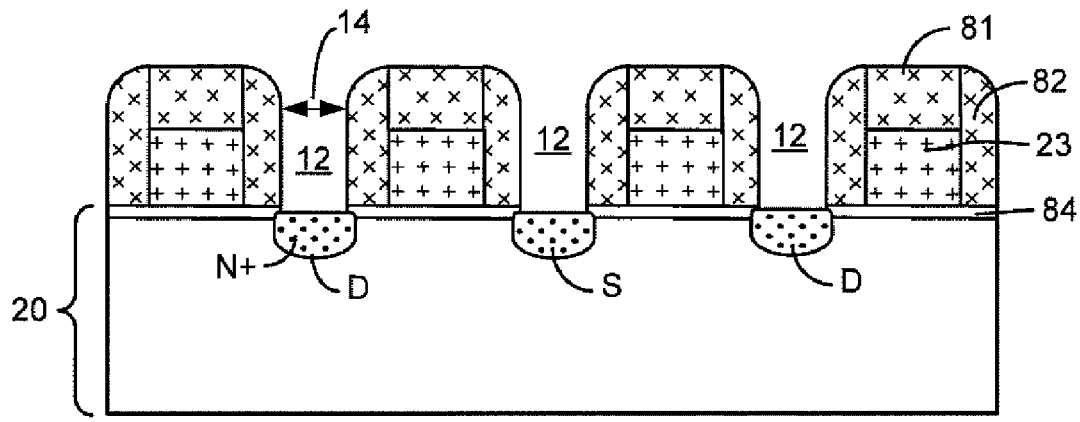
FIG. 8B illustrates the result of etching the structure of FIG. 8A, leaving sidewall spacers on the sides of the word lines and creating sidewall gaps between the sidewall spacers, and the formation of sources and drains aligned with the sidewall gaps.

FIG. 8A shows a nitride layer 80 having been deposited on the structure of FIG. 8. FIG. 8B illustrates the result of etching the structure of FIG. 8A. The etching process causes nitride layer 80 to be removed down to dielectric layers 81 and down to substrate 20 leaving sidewall spacers 82 on the sides of word lines 23. Sidewall spacers 82 are separated by sidewall gap distances 14 and create sidewall gaps 12 between sidewall spacers 82. This is followed by the formation of source and drain terminals S, D for the access transistors using nitride-covered word lines as masks aligned with the sidewall gaps. When distance 79 is a minimum lithographic feature size, at least a portion of the resulting gap 12 is a sub lithographically dimensioned gap with the corresponding sidewall gap distance 14 being a sub lithographically dimensioned distance. The use of gaps 12 created by sidewall spacers 82 to guide the formation of sources and drains for the access transistors, as well as additional device elements created beneath gaps 12, enables the process to be a fully self aligning process. Being a fully self aligning process reduces the need for additional masks thereby simplifying manufacturing procedures. The resulting array of memory devices is a contact electrode-free array, meaning it eliminates the need for additional lithographic steps to create additional contacts. The elimination of the need for such additional contacts helps to reduce the overall size of the memory cell. In addition, because the least a portion of each memory element 35 has a sub lithographically dimensioned width, the cell size can be reduced from a typical cell size of about $16F^2$ to a cell size as small as $8F^2$ to $4F^2$, typically about 6 $F^2$, F referring to the minimum features size for the manufacturing procedure used.

Figure 9:
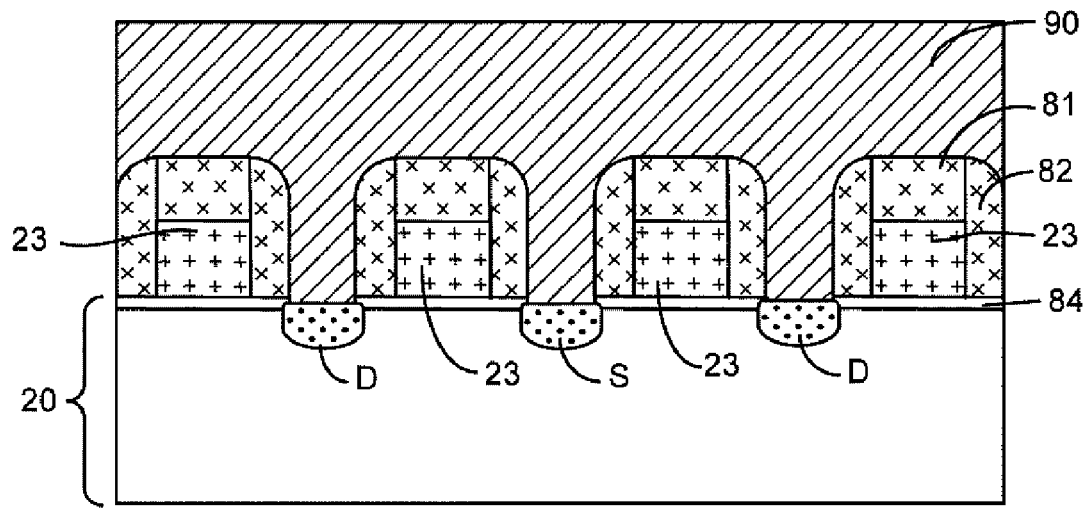
FIG. 9 shows a conductive layer deposited on the structure of FIG. 8.
Figure 10:
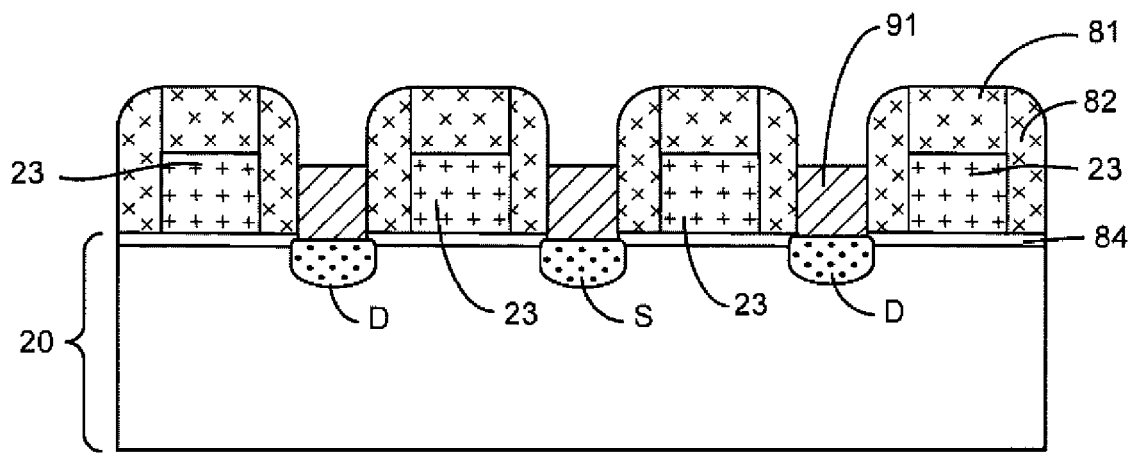
FIG. 10 shows result of etching back the conductive layer of FIG. 9.
Figure 11:
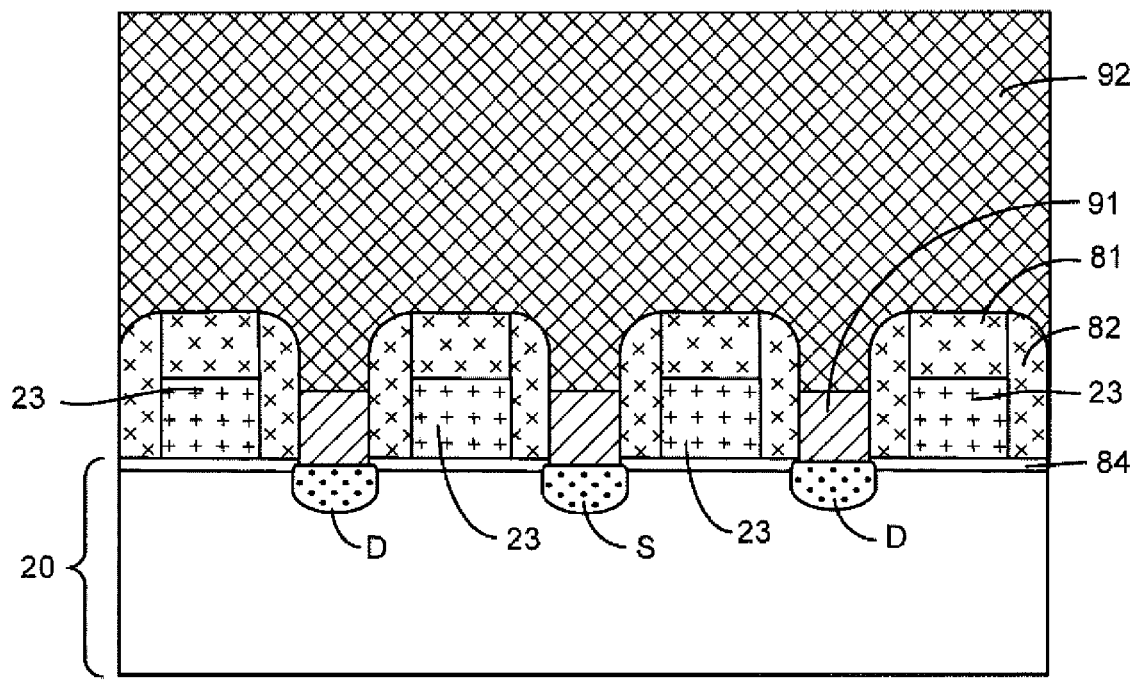
FIG. 11 shows a dielectric layer deposited on the structure of FIG. 10.

Thereafter a conductive layer 90, typically tungsten, or some other appropriate conductor such as Ti or TiN, is deposited on the structure of FIG. 8 creating the structure of FIG. 9. Conductive layer 90 is etched back as shown in FIG. 10 to create conductor elements 91. An isolation dielectric layer 92, typically silicon dioxide, is deposited on the structure of FIG. 10 to create the structure of FIG. 11. This is followed by chemical mechanical polishing resulting in the polished dielectric layer 93 of FIG. 12.

Figure 12:
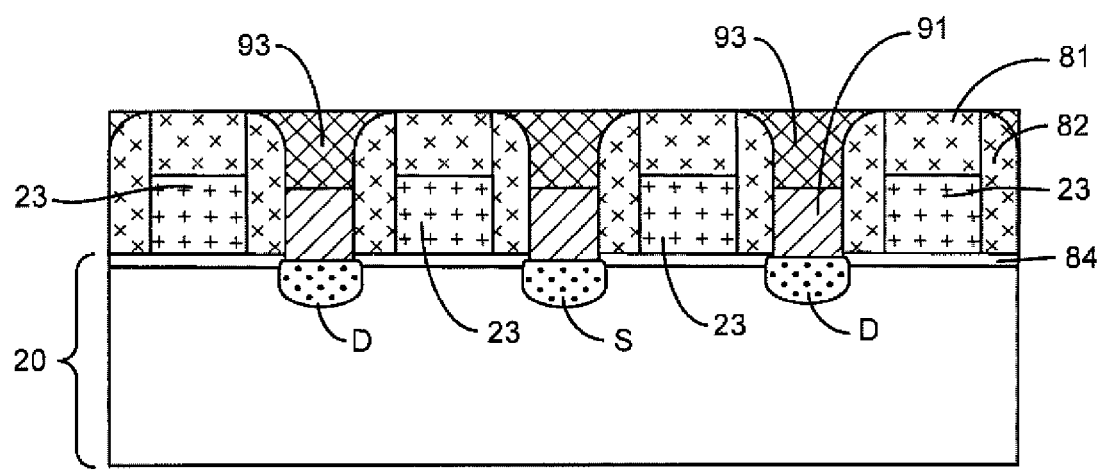
FIG. 12 shows the structure of FIG. 11 after chemical mechanical polishing.
Figure 13:
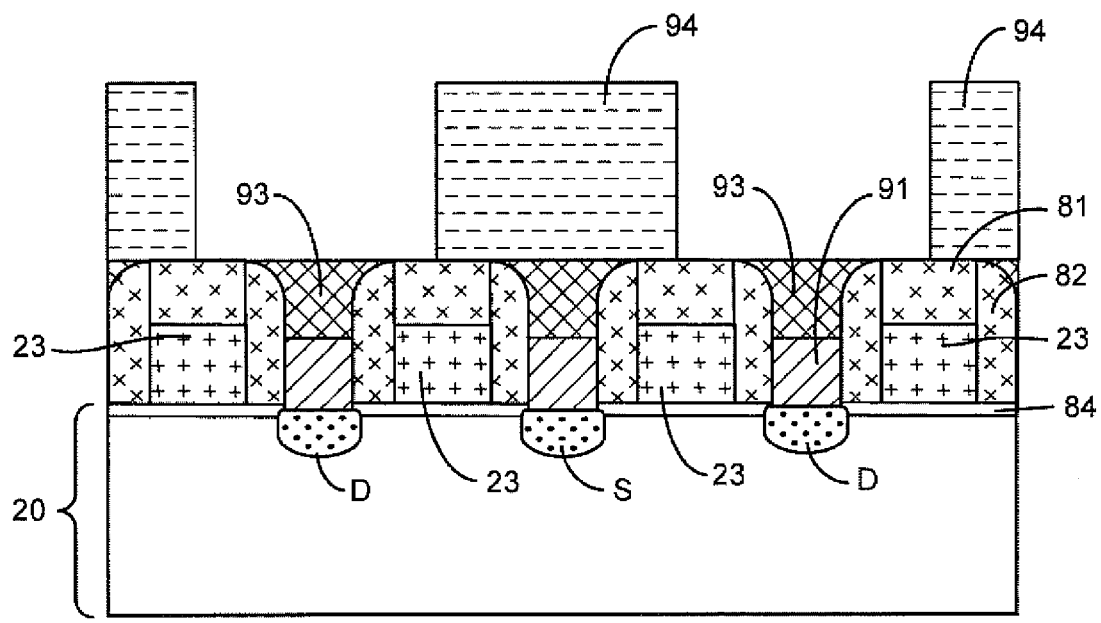
FIG. 13 shows the mask formed on the structure of FIG. 12.
Figure 14:
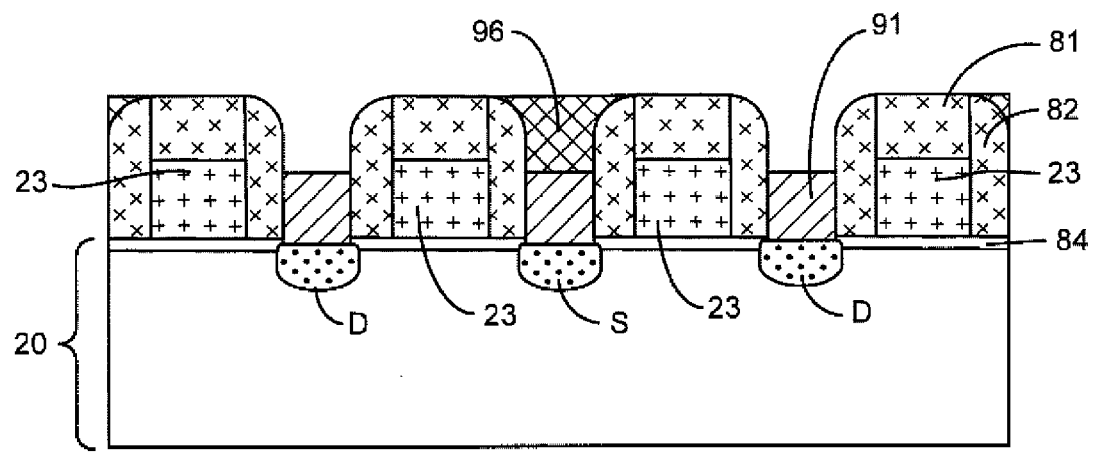
FIG. 14 illustrates the result of etching the structure of FIG. 13.
Figure 15:
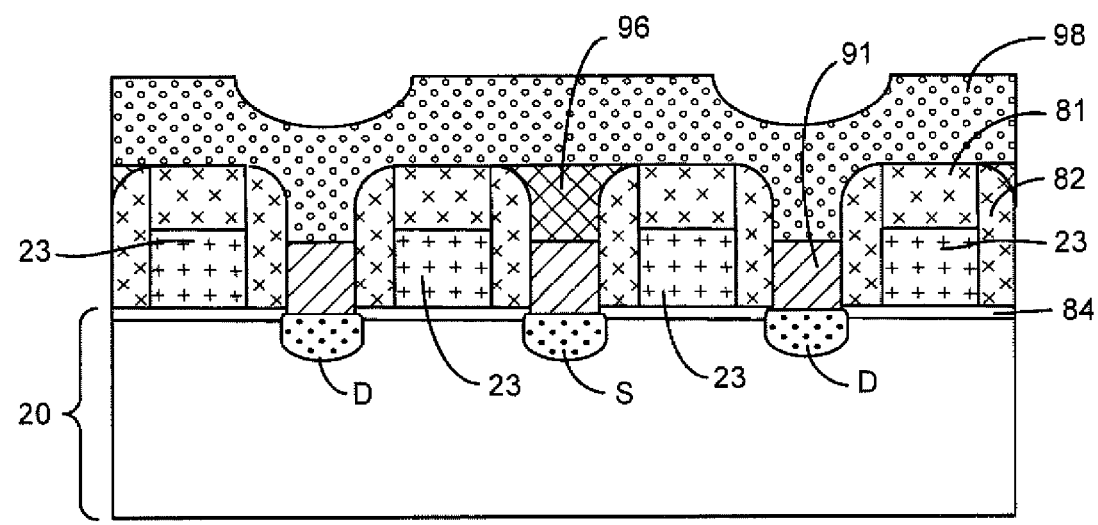
FIG. 15 shows a memory material deposit on the structure of FIG. 14.
Figure 16:
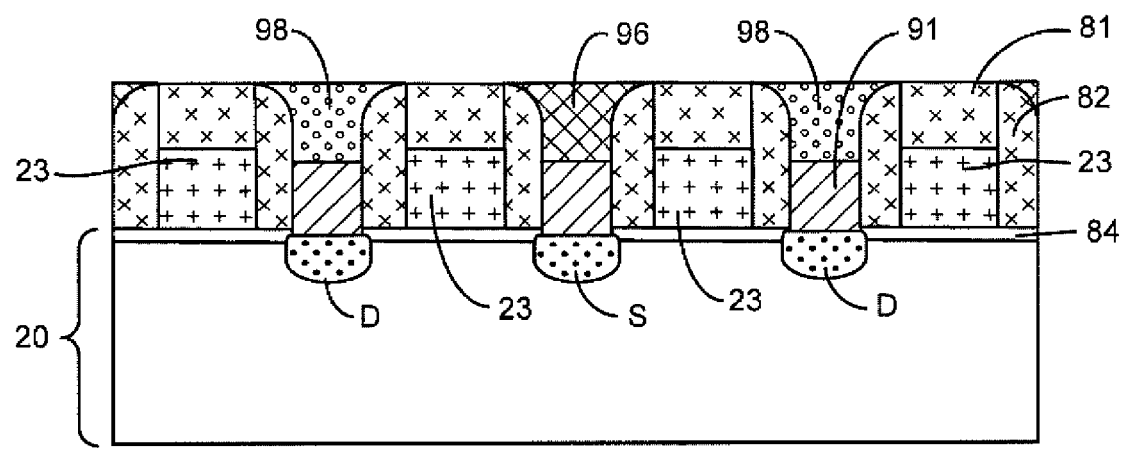
FIG. 16 shows the results of a memory material chemical mechanical processing step.

FIG. 13 shows a mask 94 formed over the structure of FIG. 12, the mask aligned with what will be the sources for the access transistors. FIG. 14 shows results of etching away those portions of polished dielectric layer 93 not covered by mask 94 leaving etched dielectric 96 in the region above the sources while exposing those conductor elements 91 above the drains and not covered by dielectric material. FIG. 15 shows the result of depositing a phase change memory material 98 on the structure of FIG. 14 with the memory maternal contacting the conductor elements 91 overlying him in contact with the drains. FIG. 16 illustrates result of a chemical mechanical polishing step of the memory material 98 of FIG. 15 to create a first subassembly.

Figure 17:
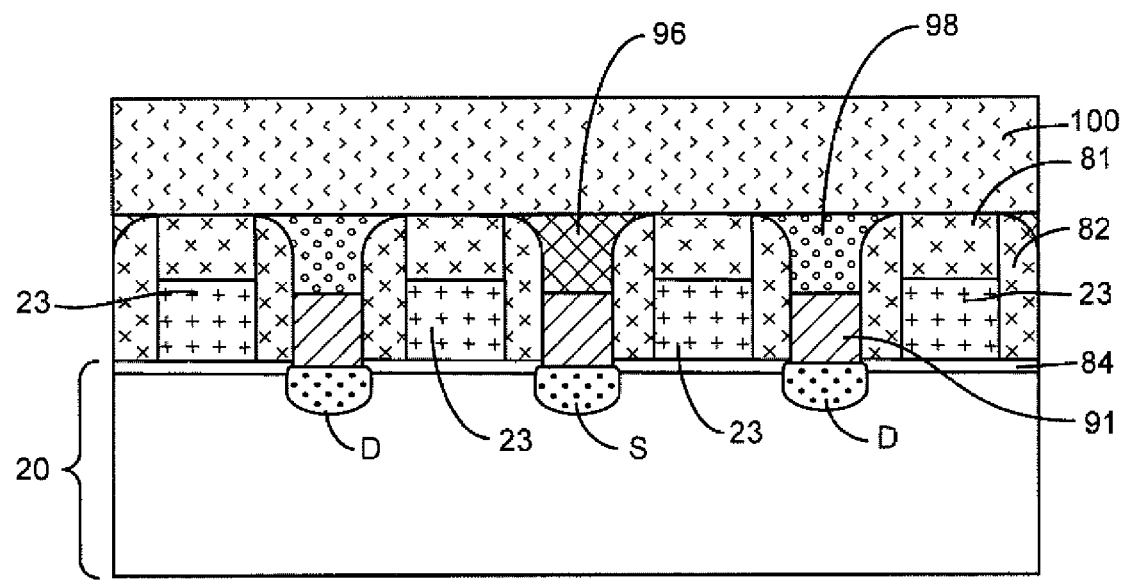
FIG. 17 shows a metal bit line layer deposited on the structure of FIG. 16.
Figure 18:
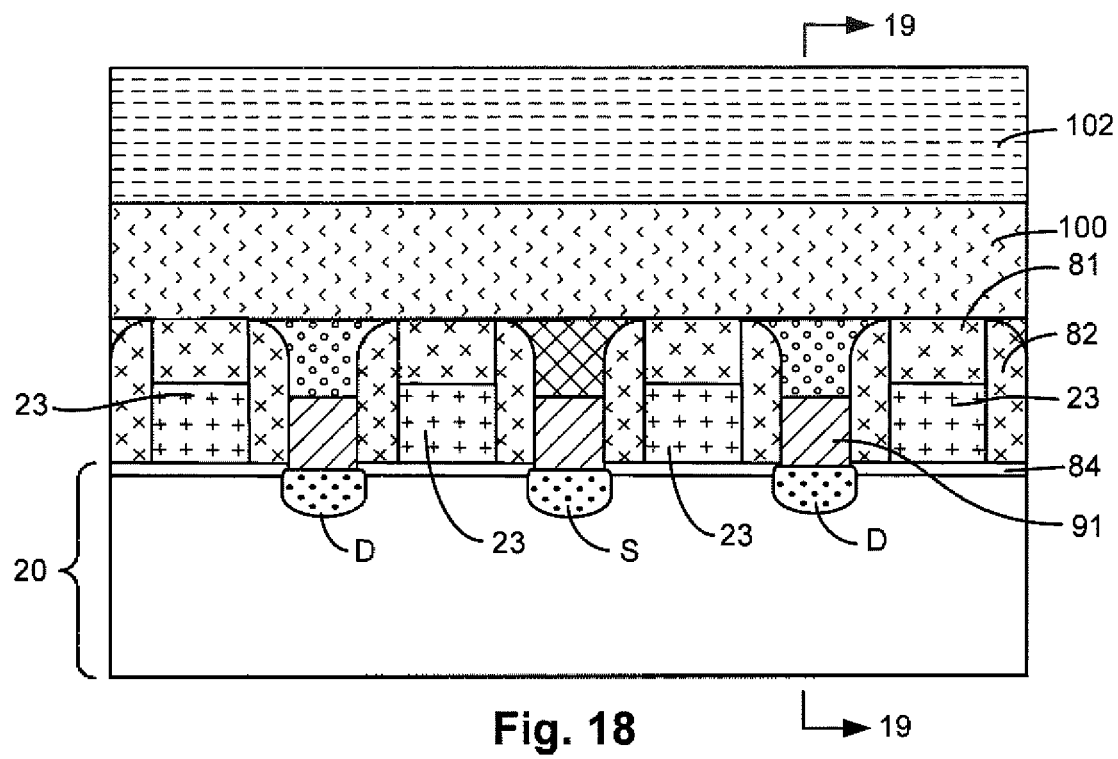
FIGS. 18 and 19 show the structure of FIG. 17 with a second mask formed on the metal bit line layer of FIG. 17.
Figure 19:
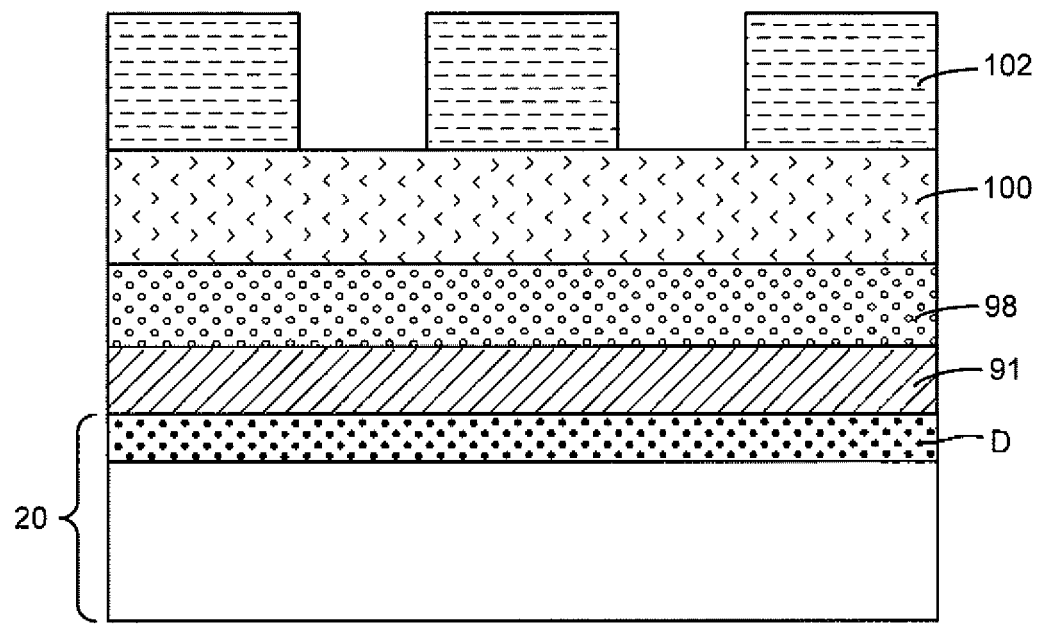
Figure 21:
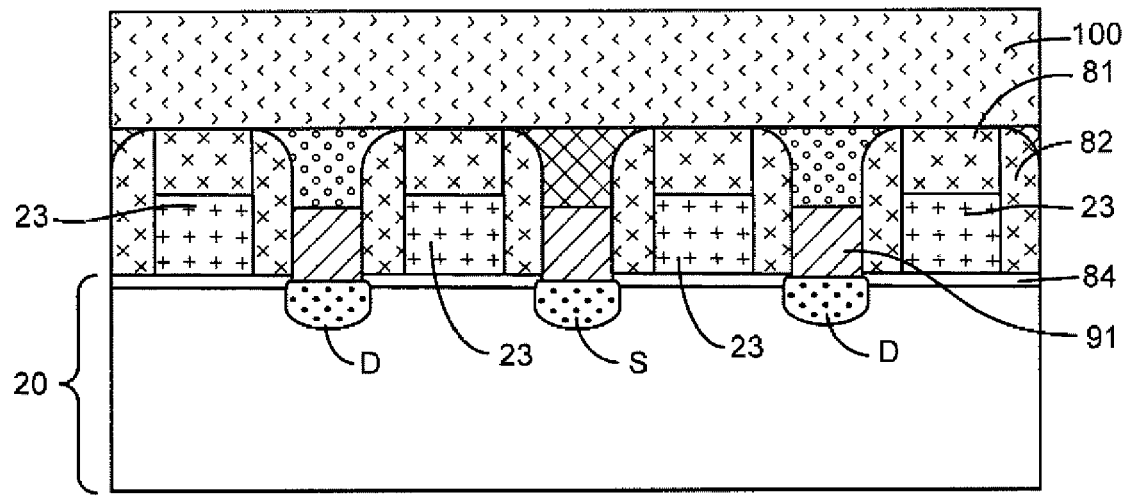
FIG. 21 is a side view of the structure of FIG. 20 after removal of the second mask.
Figure 20:
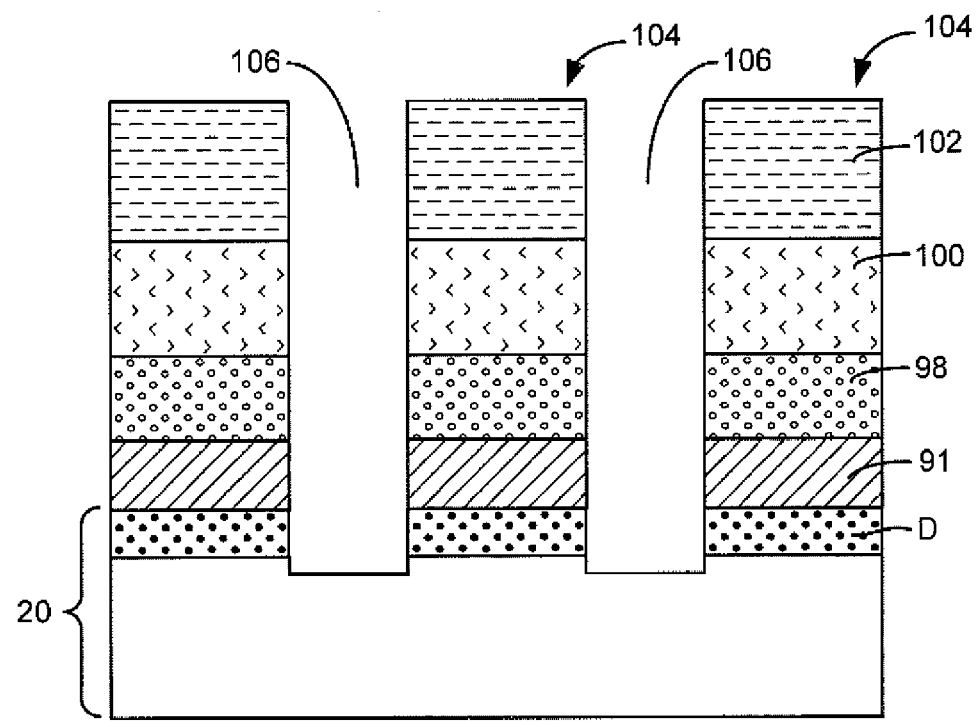
FIG. 20 shows result of etching the structure of FIG. 19 down to the substrate creating bit line stacks.

FIG. 17 shows the result of depositing a metal bit line layer 100 onto the structure of FIG. 16 to create a second subassembly. FIGS. 18 and 19 illustrate the structure of FIG. 17 with a second mask 102 formed on metal bit line layer 100. FIG. 20, similar to FIG. 5, shows result of etching the structure of FIG. 19 down to substrate 20 using second mask 102 thereby creating bit line stacks 104 separated by trenches 106. As indicated in FIGS. 4, 6 and 7, this etching stops at dielectric layers 81 overlying word lines 23 and dielectric 86 overlying source lines 28. FIG. 21 is a side view of the structure of FIG. 20 after removal of second mask 102. This is followed by a dielectric fill-in procedure and chemical mechanical polishing resulting in the structure of FIGS. 3-7.

Figure 22:
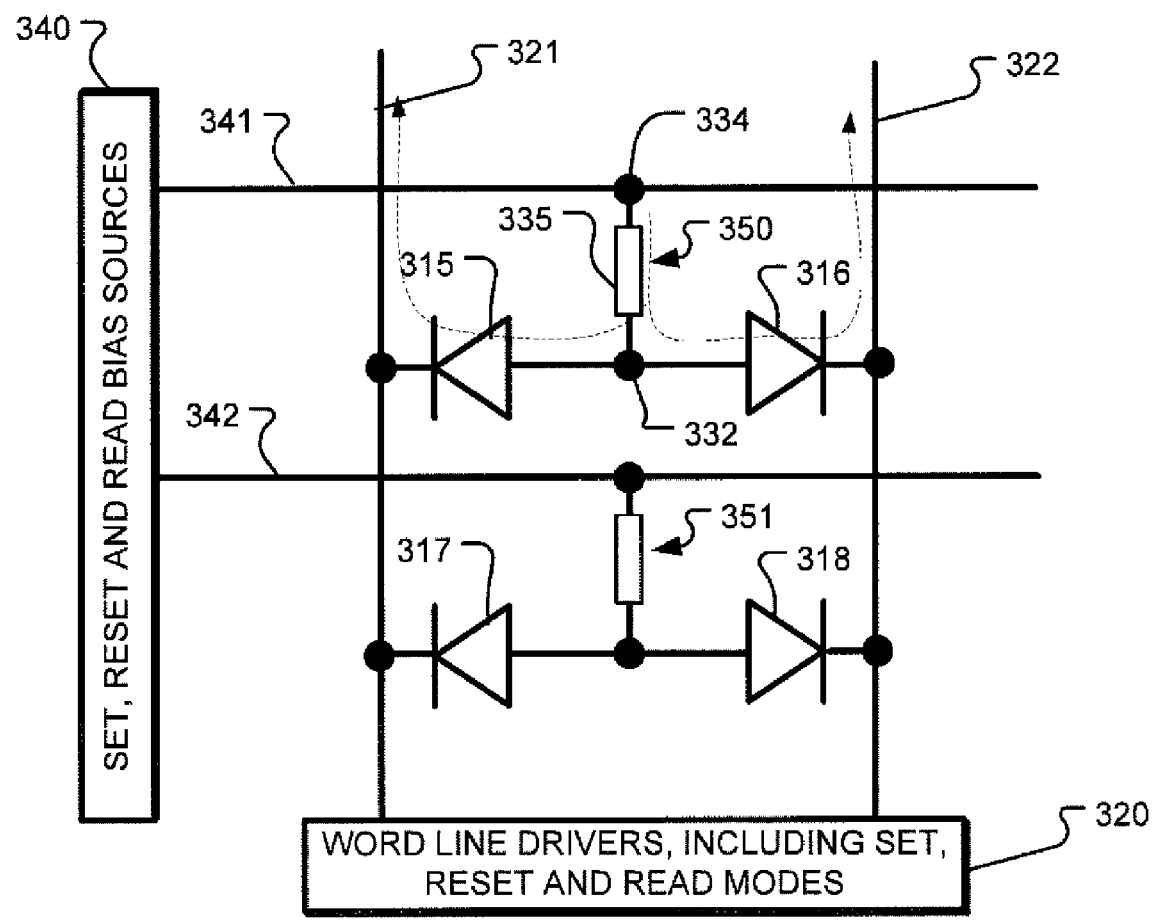
FIG. 22 is a schematic diagram for an alternative memory array comprising phase change memory cells with dual word lines which also act as source lines.

FIG. 22 illustrates an alternative implementation, in which the access devices comprise diodes. FIG. 22 shows a first memory cell 350, comprising a top electrode 334, a memory element 335 and a bottom electrode 332. A second memory cell 351 is also shown in the figure. A first word line conductor 321 and a second word line conductor 322 are coupled to word line drivers 320 which are operable in the set, reset and read modes as described above. A first bit line 341 and a second bit line 342 are coupled to biasing sources 340 for the set, reset and read modes, as well as sense amplifiers and data-in structures (not shown). A diode 315 and a diode 316 act as dual access devices for memory cell 350 while diodes 317 and 318 act as dual access devices for memory cell 351. The bottom electrode 332 of the memory cell 350 is coupled to the anode of the diode 315, and to the anode of the diode 316. The cathode of diode 315 is coupled to the word line conductor 321, and the cathode of the diode 316 is coupled to the word line conductor 322. In this embodiment, the word line conductors 321 and 322 act as both word lines and a source lines, in contrast to the embodiment of FIG. 1 which includes separate conductors as the source lines (28a, 28b, 28c) and the word lines (23a, 23b, 23c, 23d).

In operation, during the reset mode both word lines 321 and 322 are set to a low voltage such as ground, or other voltage sufficient cause the diodes 315, 316 to be conductive. The word lines 321 and 322 act as source lines in this mode, and current flows through the memory cell 350 along both word line conductors 321, 322 to establish a relatively low resistance path for the reset mode. During a read mode, only one of the word lines 321, 322 is set to a low voltage. During a set mode, only one of the word lines 321, 322 is set to a low voltage. As mentioned above, in some embodiments both of the word lines 321, 322 can be set to the low voltage during a set mode.

Figure 23:
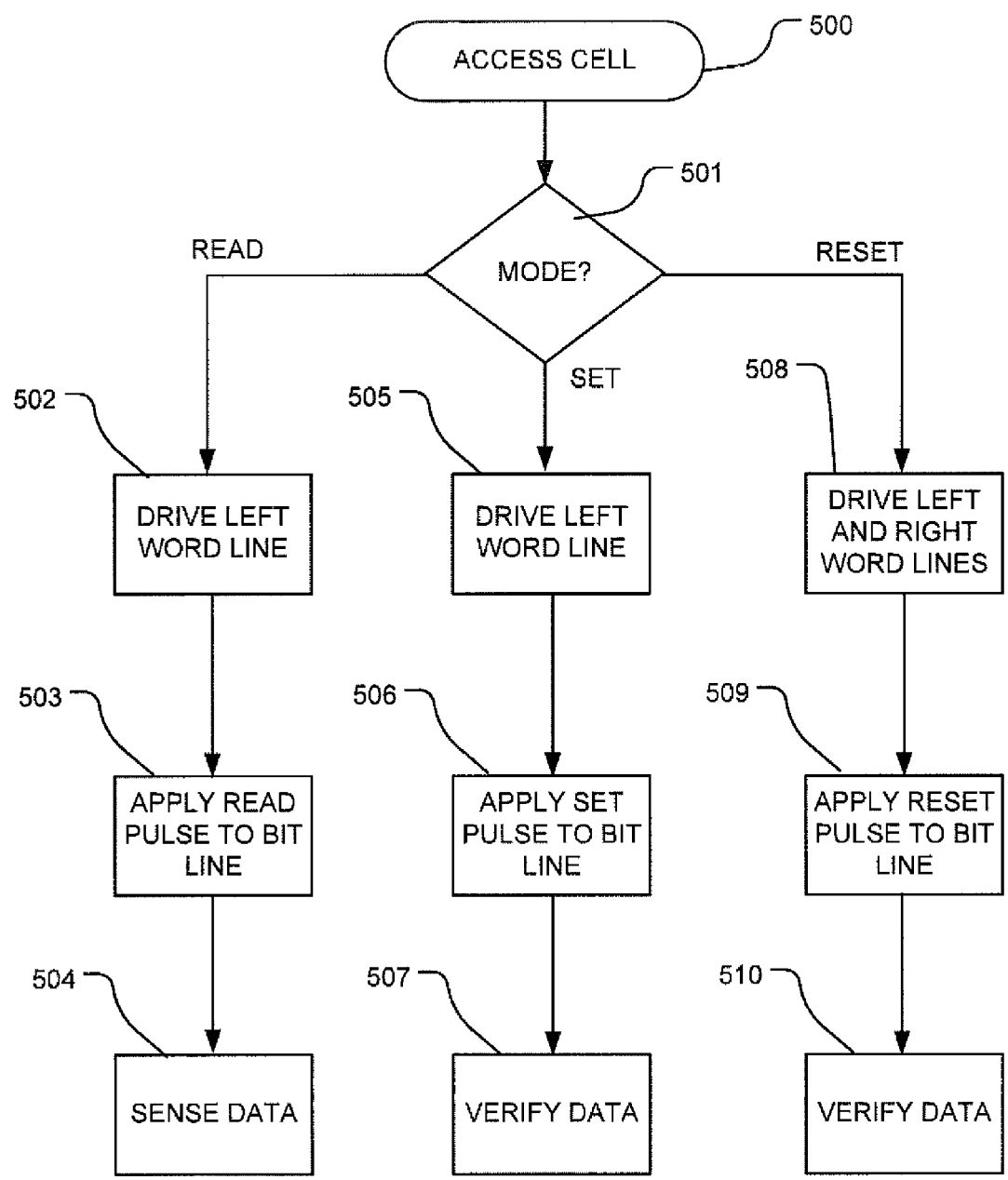
FIG. 23 is a flow chart for a method of operating memory devices as described herein.

FIG. 23 illustrates a basic method of operating a memory device such as that illustrated in FIG. 3 having dual word line/source line structures. The process illustrated in FIG. 23 is executed under control of the state machine 69 of FIG. 2, for the illustrated embodiment. The process is executed upon a command to access a selected memory cell (500). Upon receiving the command, the process determines the mode of access (501). If the mode of access is the read mode, then the control logic enables the word line drivers to drive to the left word line with the voltage sufficient to enable current flow through the left access device and the selected memory cell, while leaving the right word line with a voltage sufficient to prevent current flow through the right access device (502). Next a read bias pulse is applied to the bit line corresponding with the selected memory cell (503). Finally, the data of the selected memory cell is sensed (504).

If the mode of access is the set mode, then the operation is similar. The control logic enables the word line drivers to drive to the left word line with the voltage sufficient to enable current flow through the left access device and the selected memory cell, while leaving the right word line with a voltage sufficient to prevent current flow through the right access device (505). Next, a set bias pulse is applied to the bit line corresponding with the selected memory cell (506). Finally, the data of the selected memory cell is verified (507).

If the mode of access is the reset mode, then the control logic enables the word line drivers to drive both the left word line and the right word line with a voltage sufficient to enable current flow through the left and right access devices in parallel (508). Next, a reset pulse is applied to the bit line (509). Finally, the data of the selected memory cell is verified (510).

As mentioned above, in an alternative embodiment, during the set mode, or during one or more of the set modes for multilevel cells, the control logic can enable driving both word lines in the manner described for the reset mode.

It will be understood that a wide variety of materials can be utilized in implementation of the structure illustrated in FIG. 3. For example, copper metallization can be used. Other types of metallization, including aluminum, titanium nitride, and tungsten based materials can be utilized as well. Also, non-metal conductive material such as doped polysilicon can be used. The electrode material in the illustrated embodiment is preferably TiN or TaN. Alternatively, the electrodes may be TiAlN or TaAlN, or may comprise, for further examples, one or more elements selected from the group consisting of Ti, W, Mo, Al, Ta, Cu, Pt, Ir, La, Ni, and Ru and alloys thereof. The various dielectric materials comprise silicon dioxide, a polyimide, silicon nitride or other dielectric fill materials. In embodiments, the fill layer comprises a relatively good insulator for heat as well as for electricity, providing thermal and electrical isolation for the phase change memory elements.

The process may involve formation of a low-temperature dielectric, such as a silicon nitride layer or silicon oxide layer, using a process temperature less than about 200 degrees C. One suitable process is to apply silicon dioxide using plasma enhanced chemical vapor deposition PECVD.

In some situations that may be desirable to deposit dielectric material using a higher temperature process such as high-density plasma chemical vapor deposition HDP CVD. Also, various masks may be formed and patterned in a mask lithographic process where the minimum feature size may be on the order of 0.2 microns (200 nm), 0.14 microns, or 0.09 microns in current mask lithographic processes. Embodiments of the process can be adapted to narrower minimum feature sizes as lithographic processes advance. Also, sub-lithographic processes may be employed, achieving line widths on the order of 40 nm or less.

In some embodiments a structure for thermally insulating memory elements 35 is provided, in addition to or instead of the disclosed dielectric materials. Representative materials for a layer of thermally insulating material include materials that are a combination of the elements silicon Si, carbon C, oxygen O, fluorine F, and hydrogen H. Examples of thermally insulating materials which are candidates for use for the thermally insulating layer include $SiO_2$, SiCOH, polyimide, polyamide, and fluorocarbon polymers. Other examples of materials which are candidates for use for the thermally insulating layer include fluorinated $SiO_2$, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void in the dielectric fill formed adjacent to the memory elements for thermal insulation. A single layer or combination of layers can provide thermal and electrical insulation.

The above descriptions may have used terms such as above, below, top, bottom, over, under, et cetera. These terms are used to aid understanding of the invention are not used in a limiting sense.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are incorporated by reference.

The invention claimed is:

1. A self aligning memory device, the memory device of the type comprising a memory element switchable between electrical property states by the application of energy, the memory device comprising:
   a substrate;
   first, second, third and fourth word lines positioned over the substrate and oriented in a first direction, the word lines having tops and sides, at least the sides covered with a dielectric material, the dielectric material defining first and second and third gaps therebetween;
   terminals of access devices formed within the substrate and aligned with the first, second and third gaps, a first terminal located directly under the second gap and a second terminal formed directly under each of the first and third gaps;
   first and second source lines positioned within and aligned with the first and third gaps and electrically connected to respective ones of the second terminals;
   a first electrode within and aligned with the second gap and electrically connected to the first terminal;
   a memory element within and aligned with the second gap positioned over and electrically connected to the first electrode;
   a second electrode positioned over and contacting the memory element and oriented in a second direction, the second direction being perpendicular to the first direction; and
   the first terminal, the first electrode and the memory element being self aligning structures.

2. The memory device of claim 1, wherein the second electrode comprises a bit line conductor.

3. The memory device of claim 1, wherein the access devices comprise first and second transistors with a common drain.

4. The memory device of claim 3, wherein the common drain constitutes the first terminal.

5. The device of claim 1, wherein:
   the memory element comprises an active region;
   at least the active region comprises a phase change material having an amorphous phase and a crystalline phase;
   the memory element has a set state and a reset state; and
   at least a substantial portion of an active region of the memory element is in the amorphous phase in the reset state and at least a substantial portion of the active region of the memory element is in the crystalline phase in the set state.

6. The device of claim 1, wherein the word lines are separated by a distance equal to a minimum lithographic distance so that at least a portion of the second gap is a sub lithographically dimensioned second gap, said memory element having a width defined by the second gap with at least a portion of the width being a sub lithographically dimensioned width.

7. The device of claim 1, wherein the memory element has a thickness measured parallel to the first direction, and further comprising a plurality of said second electrodes, said second electrodes separated by trenches, said trenches defining said thickness.

8. A self aligning memory device, the memory device of the type comprising a memory element switchable between electrical property states by the application of energy, the memory device comprising:
   a substrate;
   first, second and third word lines positioned over the substrate and oriented in a first direction, the word lines having tops and sides, at least the sides covered with a dielectric material, the dielectric material defining first and second gaps therebetween;
   first and second transistors formed within the substrate, the transistors comprising terminals, a first terminal located directly under and aligned with the second gap and a second terminal formed directly under and aligned with the first gap;
   a common source line positioned within and aligned with the first gap and electrically connected to the second terminal;
   a first electrode within and aligned with the second gap and electrically connected to the first terminal;

a memory element within and aligned with the second gap positioned over and electrically connected to the first electrode;

a second electrode positioned over and contacting the memory element and oriented in a second direction, the second direction being perpendicular to the first direction; and the first terminal, the first electrode and the memory element being self-aligned structures.

9. The memory device according to claim 1, wherein:

the second electrode overlies and directly contacts the memory element;

the second electrode directly contacts the dielectric material covering the word line; and the first electrode extends in the first direction and directly contacts the memory element.

* * * * *